United States Patent [19]

Yun et al.

[11] Patent Number: 5,759,870
[45] Date of Patent: Jun. 2, 1998

[54] METHOD OF MAKING A SURFACE MICRO-MACHINED SILICON PRESSURE SENSOR

[75] Inventors: Weijie Yun, San Jose, Calif.; Liwei Lin, Kao-Hsiung, Taiwan; Tariq M. Haniff, San Mateo, Calif.

[73] Assignee: BEI Electronics, Inc., Sylmar, Calif.

[21] Appl. No.: 520,055

[22] Filed: Aug. 28, 1995

[51] Int. Cl.$^6$ .................... H01L 21/44; H01L 21/465
[52] U.S. Cl. .................... 437/228; 437/203; 437/901; 437/921; 437/927
[58] Field of Search .................. 437/26, 203, 228 H, 437/228 SEN, 921, 901, 927; 73/726, 727; 148/DIG. 50, DIG. 51, DIG. 73, DIG. 159; 257/415, 417, 418, 419, 420

[56] References Cited

U.S. PATENT DOCUMENTS

| | | | |
|---|---|---|---|
| 3,858,150 | 12/1974 | Gurtler et al. | 338/2 |
| 3,893,228 | 7/1975 | George et al. | 29/580 |
| 3,943,915 | 3/1976 | Severson | 128/2 P |
| 4,021,766 | 5/1977 | Aine | 257/415 |
| 4,100,563 | 7/1978 | Clark | 357/27 |
| 4,184,189 | 1/1980 | Davis et al. | 361/283 |
| 4,224,537 | 9/1980 | Glazer | 307/310 |
| 4,243,898 | 1/1981 | Seelbach | 307/310 |
| 4,250,452 | 2/1981 | Gray et al. | 328/1 |
| 4,317,126 | 2/1982 | Gragg, Jr. | 357/26 |
| 4,326,171 | 4/1982 | Shaw et al. | 330/256 |
| 4,463,274 | 7/1984 | Swartz | 307/491 |
| 4,465,075 | 8/1984 | Swartz | 128/672 |
| 4,480,983 | 11/1984 | Adams et al. | 425/467 |
| 4,517,547 | 5/1985 | Gray et al. | 340/59 |
| 4,655,088 | 4/1987 | Adams | 73/756 |
| 4,658,279 | 4/1987 | Guckel . | |
| 4,683,757 | 8/1987 | Adams et al. | 73/756 |
| 4,686,764 | 8/1987 | Adams et al. | 29/592 |
| 4,704,186 | 11/1987 | Jastrzebski | 148/DIG. 159 |
| 4,708,012 | 11/1987 | Folk et al. | 73/4 R |
| 4,732,042 | 3/1988 | Adams | 73/706 |
| 4,733,553 | 3/1988 | Folk et al. | 3/4 V |
| 4,889,590 | 12/1989 | Tucker et al. | 156/647 |
| 4,995,953 | 2/1991 | Yee | 204/129.3 |
| 4,996,082 | 2/1991 | Guckel et al. . | |
| 5,027,081 | 6/1991 | Baum | 330/503 |
| 5,031,461 | 7/1991 | Baskett | 73/708 |
| 5,074,152 | 12/1991 | Ellner et al. | 73/766 |
| 5,110,758 | 5/1992 | Baskett | 437/171 |
| 5,130,276 | 7/1992 | Adams et al. | 437/225 |
| 5,132,559 | 7/1992 | Baskett | 307/355 |
| 5,220,838 | 6/1993 | Fung et al. | 73/727 |
| 5,295,395 | 3/1994 | Hocker et al. . | |
| 5,344,523 | 9/1994 | Fung et al. | 437/921 |
| 5,536,963 | 7/1996 | Polla | 257/417 |

OTHER PUBLICATIONS

Motorola Semiconductor Products Sector, "Pressure Sensitive Device Data," Jan. 1994 (Rev. 2), pp. 3–18 to 3–21.
SenSym Inc., "Solid State Pressure Sensors Handbook," 1993, pp. A–19 to A–25 and 1–28 to I–28.
Bassous, "Fabrication of Novel Three–Dimensional Microstructures by the Anisotropic Etching of (100) and (110) Silicon," IEEE Trans. Electron Devices, vol. ED–25, No. 10, Oct. 1978, pp. 11780 to 1185.
D. W.Burns, "Micromechanics of Integrated Sensors and the Planar Processed Pressure Transducer," Ph.D. Thesis, Department of Material Science, University of Wisconsin–Madison, 1988.

*Primary Examiner*—John Niebling
*Assistant Examiner*—Brian K. Dutton
*Attorney, Agent, or Firm*—Townsend and Townsend and Crew; Larry Mendenhall

[57] ABSTRACT

Methods for surface micro-machining silicon wafers, including coating cavity sidewalls with oxidation-resistant material to prevent lateral oxidation. This in turn prevents "bird's beak" during formation of a diaphragm. The methods are useful for, among other things, the manufacture of absolute-type pressure sensors. Along with bulk micromachining techniques, the methods can be used to produce gauge- and differential-type pressure sensors, as well.

18 Claims, 12 Drawing Sheets

METHOD OF MAKING A SURFACE MICRO-MACHINED SILICON PRESSURE SENSOR

BACKGROUND OF THE INVENTION

The present invention relates to pressures sensor apparatus and to methods for manufacturing the same. In particular, the invention relates to pressure sensors with surface micro-machined polysilicon diaphragms.

In various settings, an engineer is interested in knowing the absolute pressure of an atmosphere, the relative pressure of a first atmosphere to a second, standard atmosphere or the relative pressures of two, possibly varying atmospheres. Pressure sensors used to measure pressure relative to a vacuum are termed "absolute," while pressure sensors for measuring pressure relative to a standard are "gauge." The third class of pressure sensors, "differential," measure relative atmospheric pressures.

One of the older forms of pressure sensors incorporates metal diaphragms. This metal construction has yielded to silicon micro-machined pressure sensors because of the latter's performance, size, weight, yield and manufacturing cost advantages. Today, two methods of silicon micro-machining are known, bulk and surface. Bulk micromachining will be explained first, then surface micro-machining.

Bulk micro-machining is a wet chemical process. The starter material is a silicon wafer, e.g., wafer 10 in FIG. 1. Wafer 10 is etched from its back 18 to produce a cavity 12. As is well known in the art of bulk micro-machining, the crystalline nature of the silicon of wafer 10 is subject to etching only in certain crystalline orientations. As a result, the cavity 12 has a square boundary at any uniform depth into the cavity 12, and walls 14 of cavity 12 slope at 54.7° relative to surface 18.

Figure 1:
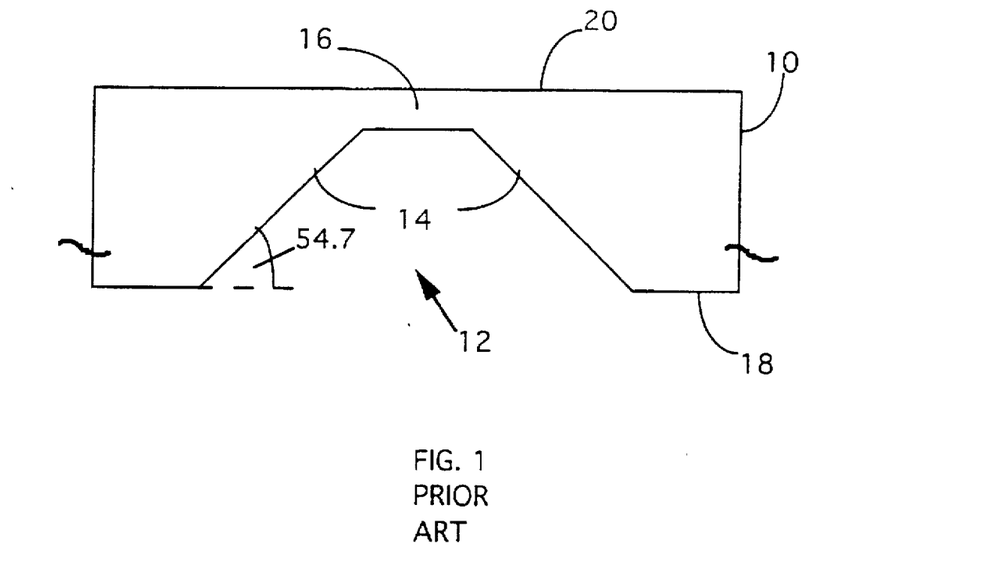
FIG. 1 is a cross-section of a bulk micro-machined diaphragm manufactured according to the prior art.

By bulk micro-machining, sufficient silicon can be etched from the back of wafer 10 to produce a diaphragm 16 on front 20 of wafer 10.

One problem with bulk micro-machining is due to the concave shape which it produces. Wafer 10 must be reinforced structurally for mechanical support. This mechanical support is typically silicon in the form of glass, bonded to back 18 of wafer 10. The packaging for mechanical support creates packaging-induced stresses.

As compared to bulk micro-machining, the process costs of surface micro-machining are significantly less since no backside wafer bonding is needed. Also, the size of the cavity can be very well controlled, as it is determined by plasma etch.

Nonetheless, surface micro-machining has several problems. In U.S Pat. No. 5,295,395, Hocker et al. describe the problem of "bird's beak," the formation of a ridge over the edge of a cavity due to the growth of oxide in an upward direction. "Bird's beak" can have a negative impact on the performance of a sensor because it destroys the substantially flat surface necessary for a well functioning sensor. Hocker et al. describe a patterning and etching process which removes "bird's beak." However, in their patent, some extra patterning and etching processes were used. Those processes not only eliminate the "bird's beak" but also create a gap between the newly enlarged side walls and the old filling silicon dioxide. In their approach, wafer-wafer bonding follows such that the gap is not a problem.

Figure 2:
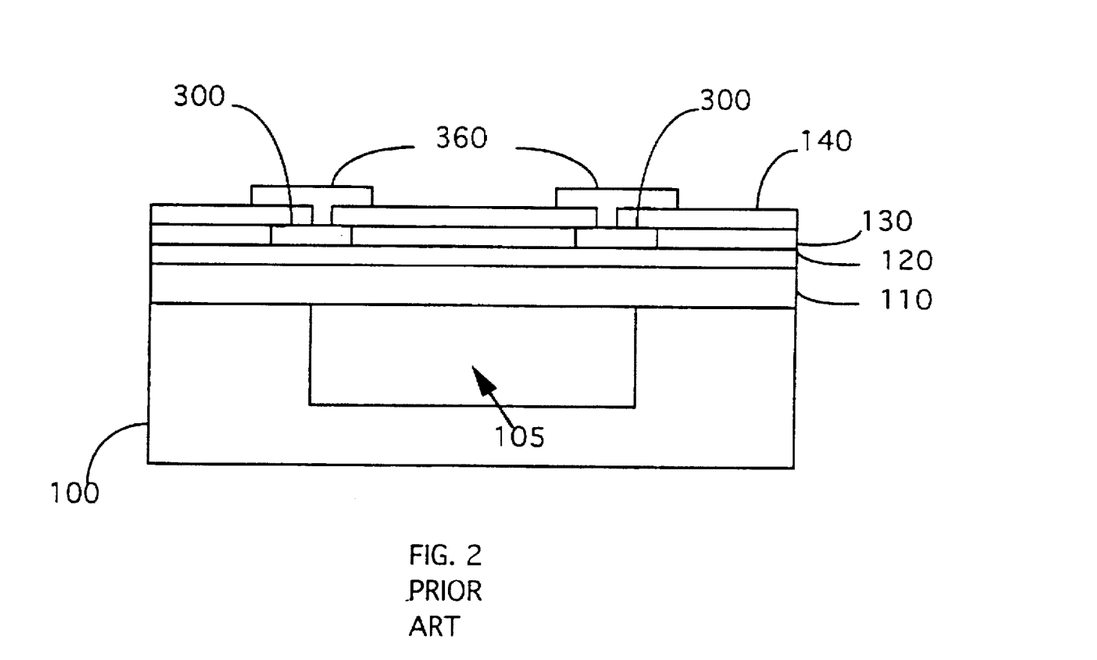
FIG. 2 is cross-section of a surface micro-machined pressure sensor according to the prior art.

Another problem with surface micro-machining of the prior art is the interface problem presented by the manufacturing method. FIG. 2 shows a pressure sensor of the prior art, including silicon wafer 100 with cavity 105. A layer 110 of polysilicon lies on wafer 100, topped by layers of oxide 120 and 140. The polysilicon layer 130 which forms piezoresistors 300 is separated from the polysilicon diaphragm 110 by the oxide layer 120. Therefore, the stress level in the piezoresistors 300 is different from the stress level in the polysilicon diaphragm 110. This will affect the non-linearity of the pressure sensor, as well as the hysteresis and long-term drift.

Accordingly, the objects of this invention include a surface micro-machined pressure sensor apparatus with minimal "bird's beak" and a method for manufacturing the same. Another object of this invention is a pressure sensor with improved wear characteristics and a method for manufacturing the same. Of course, other objects of this invention will become apparent on the reading of this entire disclosure.

SUMMARY OF THE INVENTION

In one embodiment, the invention includes a method for micro-machining a silicon wafer which has a cavity with side walls. The method includes depositing a material resistant to oxidation along the side walls, oxidizing the silicon in the cavity until the surface of the silicon dioxide is level with the top of the wafer, depositing a first diaphragm layer above the top of the wafer and the surface of the silicon dioxide, and evacuating the silicon dioxide and the material resistant to oxidation from the cavity. Depositing the oxidation-resistant material only along the side walls can be accomplished by depositing the material along both the side walls and the bottom of the cavity, then etching away the material along the bottom. The evacuation of the cavity can be accomplished by patterning and etching the diaphragm layer for one or more etch holes, and etching away the silicon dioxide and the oxidation-resistant material in the cavity.

In a preferred embodiment, the micro-machining method also includes a step of sealing the cavity by depositing a second diaphragm layer which fills the etch holes and forms a single, integral diaphragm layer with the first diaphragm layer. The conditions under which the sealing can be performed include near vacuum conditions and a predetermined atmospheric pressure, producing a predetermined pressure in the cavity when it is sealed.

The preferred choice of an oxidation-resistant material is silicon nitride.

The micro-machining method can also include a step to implant piezoresistors in the integral diaphragm layer.

In another embodiment, the invention includes a method for micro-machining a silicon wafer with first and second sides opposite each other. The first side has a first cavity with side walls and a bottom. The method includes depositing an oxidation-resistant material along the side walls, oxidizing the silicon in the cavity; patterning the second side for a second cavity, etching the second cavity in the second side so that the bottom of the second cavity reaches the bottom of the first cavity, and evacuating the first cavity through the second cavity. Before the evacuation, a layer of polycrystalline silicon can be deposited over and spanning the first cavity.

The invention also includes the apparatus manufactured by the above-described methods.

DESCRIPTION OF THE PREFERRED EMBODIMENT

With reference to FIGS. 3A through 4G, the processes for manufacturing sensors according to the present invention are described below. The manufacture of absolute-type pressure sensors is described first, that of differential- and gauge-type sensors follows thereafter. (Figures are not drawn to scale.)

Figure 3A:
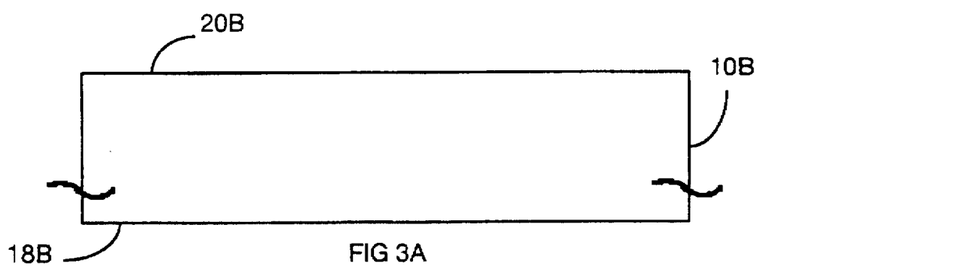
FIGS. 3A through 3L are wafer cross-sections illustrating a manufacturing method of the invention.
Figure 3B:
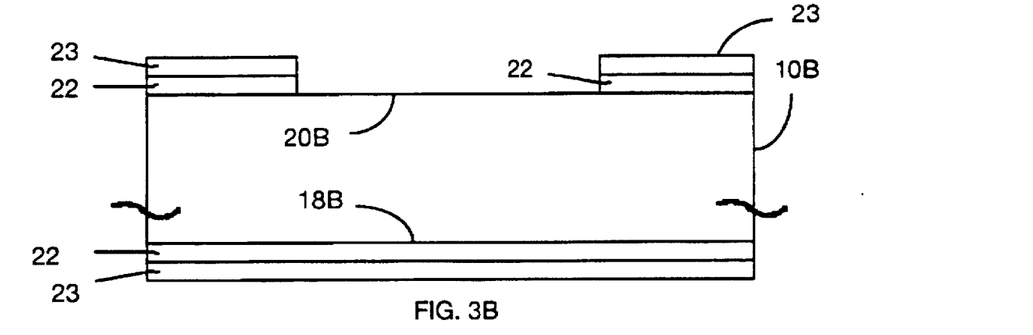
Figure 3C:
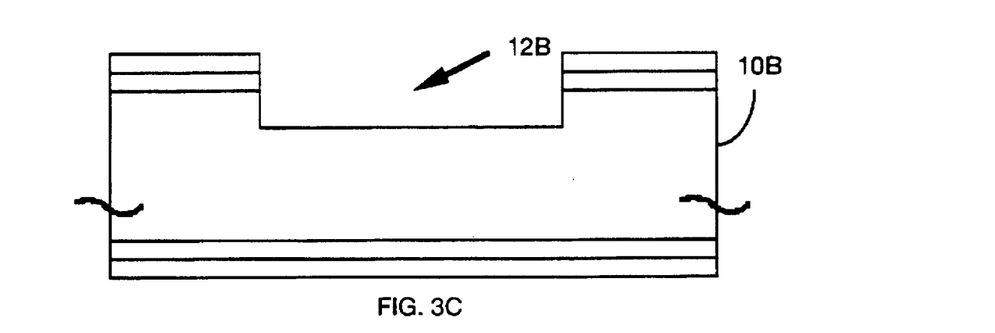

FIG. 3A shows the starting material for an absolute-type pressure sensor, prime (100)-oriented wafer 10B. Wafer 10B has top 20B and bottom 18B. FIG. 3B shows wafer 10B once surface 20B has been patterned for a cavity. Layer 22 of silicon nitride has been deposited to a thickness of 0.15 μm by low pressure chemical vapor deposition (LPCVD) onto both top 20B and bottom 18B. Layer 22 on surface 18B is completely covered with photoresist 23 while layer 22 on surface 20B is partially patterned with a mask for a cavity. Here, "to pattern" a surface preferably means to apply photoresist to that surface, pre-bake the photoresist, align the surface with a photomask, expose and develop the photoresist, bake the wafer and then etch away the surfaces not protected by the photoresist. The final step of "patterning" is the removal of the photoresist. Of course, other methods for patterning known in the art may be used instead. For the partial patterning of this step, the photoresist, layer 23, is left in place. In FIG. 3C, the substrate of wafer 10B is plasma etched to form cavity 12B. The cavity can be any shape, though for illustration purposes, the cavity is taken to be a square.

Figure 3D:
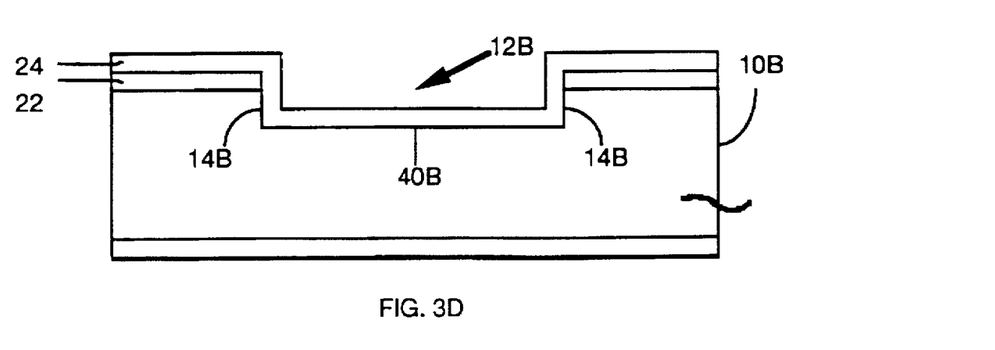
Figure 3E:
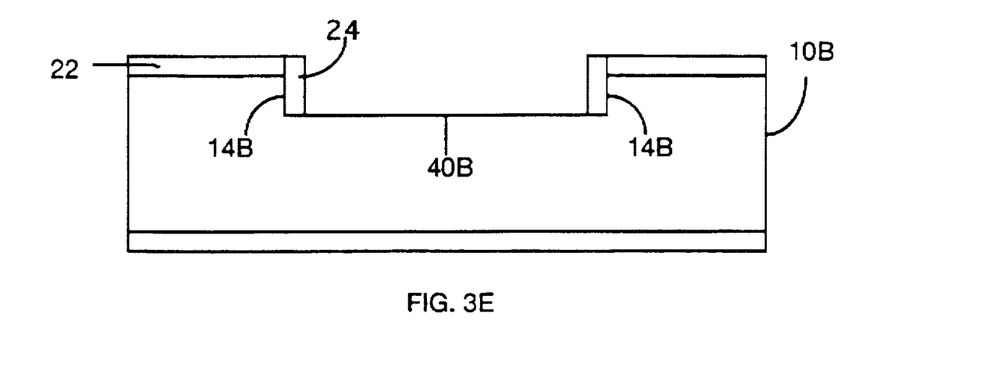

FIG. 3D illustrates the LPCVD deposition of a second layer 24 of silicon nitride after photoresist 23 has been removed. Layer 24 covers the surface of wafer 10B, including side walls 14B and bottom 40B of cavity 12B. Layer 24 combines with the remnants of layer 22 to create a doubly thick layer of silicon nitride outside of cavity 12B, while layer 24 alone creates a singly thick layer of silicon nitride inside cavity 12B along bottom 40B and side walls 14B. Subsequently, a blank nitride etch removes the portion of layer 24 along bottom 40B and top 20B but does not attack the portion of layer 24 deposited on side walls 14B. The result is wafer 10B of FIG. 3E.

FIGS. 3F through 3I illustrate the filling and evacuation of cavity 12B according to the invention. Silicon dioxide layer 26 is grown to fill cavity 12B. Layer 26 will support the diaphragm manufactured over cavity 12B as described below. As is well known in the art, due to the oxygen diffusion necessary after the initial oxide growth, layer 26 grows about half up from bottom 40B of FIG. 3E and about halfway down from bottom 40B. Notably, layer 24 along side walls 14B prevents lateral oxidation so that only minimal "bird's beak" forms near the edges of cavity 12B. The height of "bird's beak" from the processes of the invention is approximately 30Å.

The fabrication of the micro-diaphragm is as follows. Layer 22 is removed from both top 20B and bottom 18B of wafer 10B. LPCVD low temperature oxide (LTO) layer 28 is then deposited. Layer 28 is then patterned for etch channels 28B and plasma etched. While one etch channel 28B (and one etch hole) is sufficient, more than one etch channel 28B (and more than one etch hole) is preferred.

Figure 3F:
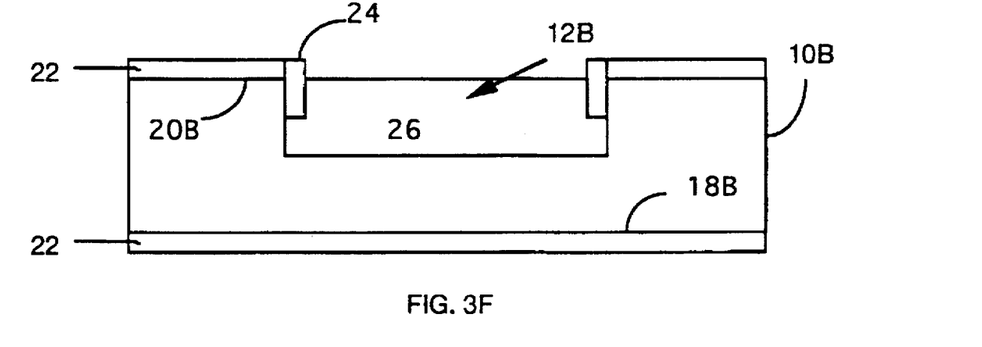
Figure 3G:
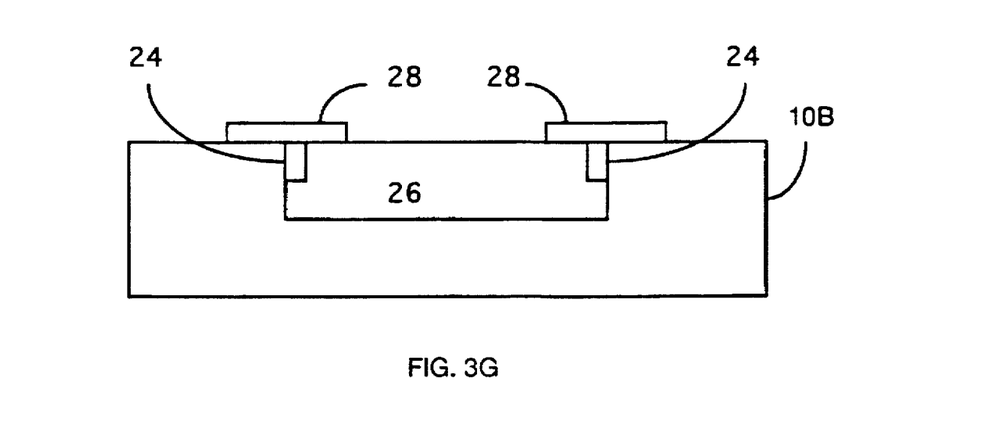
Figure 3H:
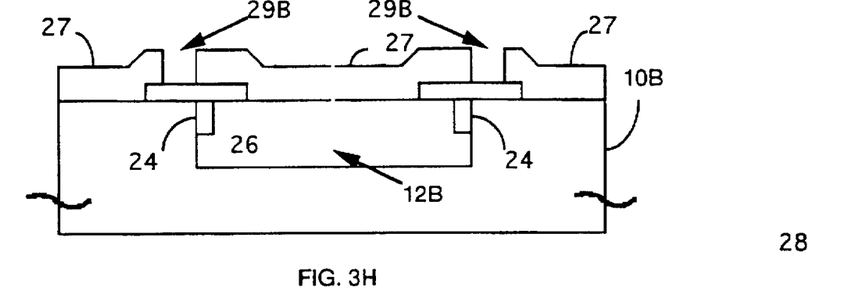

At this juncture, wafer 10B appears as in FIG. 3G. Polycrystalline silicon 27 is deposited, patterned for etch holes 29B and plasma etched. This produces wafer 10B of FIG. 3H. The LTO of layer 28, thermal oxide 26 filling micro-cavity 12B, and the remainder of silicon nitride layer 24 covering the upper portions of side walls 14B are all etched away using concentrated hydrofluoric acid (HF) through etch holes 29B. (In the preferred embodiments, the concentrated HF solution is 48% by weight.) Wafer 10B is then fully rinsed in deionized (DI) water. Wafer 10B appears as in FIG. 3I.

Figure 3I:
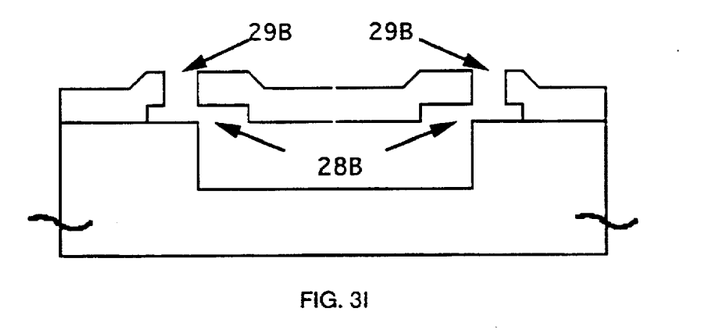
Figure 3J:
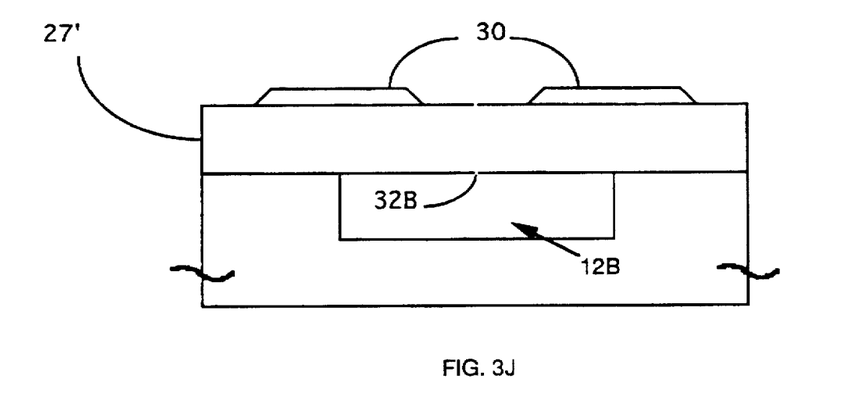
Figure 3K:
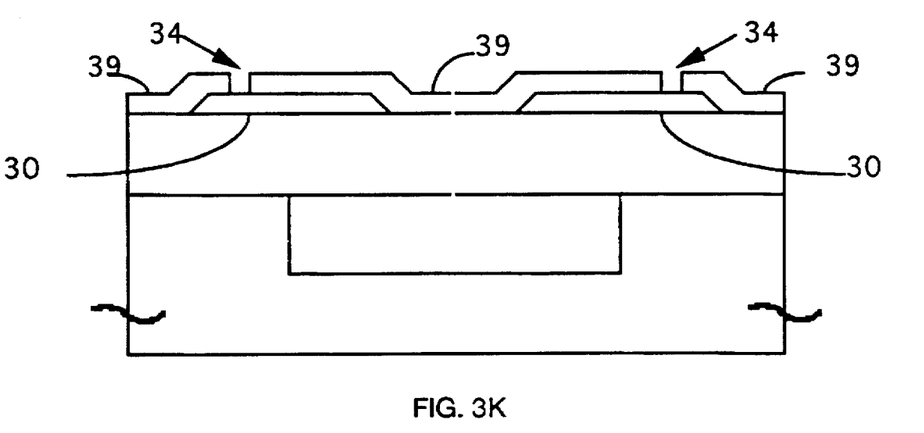
Figure 3L:
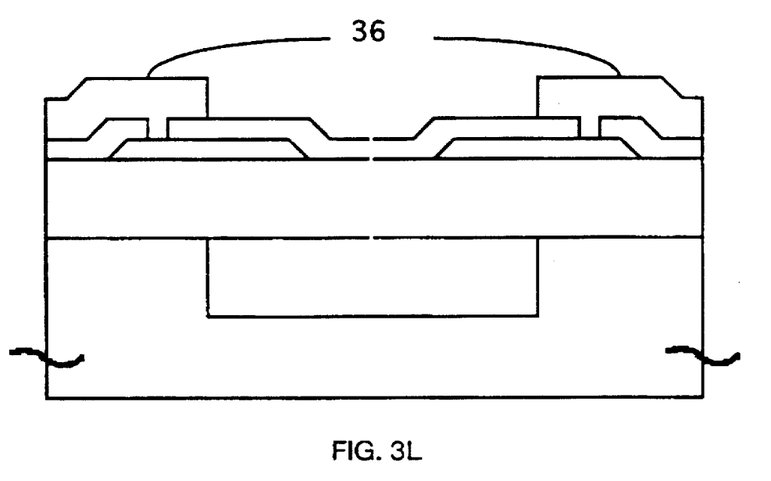

As FIG. 3J shows, etch holes 29B and channels 28B of FIG. 3I are then sealed by LPCVD of a second layer of polysilicon to form double layer 27'. The sealing polysilicon does not fill cavity 12B. Performing this deposition under low pressure preserves the low pressure in micro-cavity 12B. Piezoresistors 30 of FIG. 3J are patterned and ion implanted onto polysilicon diaphragm 32B. Following the deposition of layer 39, 0.35 μm of LTO passivation, contact holes 34 are opened down to resistors 30, as in FIG. 3K. Metal contacts 36 are then sputtered, patterned and etched. See FIG. 3L. Notably, the piezoresistors are implanted in undoped polysilicon layer 27', and only one layer each of polysilicon and oxide result, thereby substantially reducing interface problems.

Figure 9:
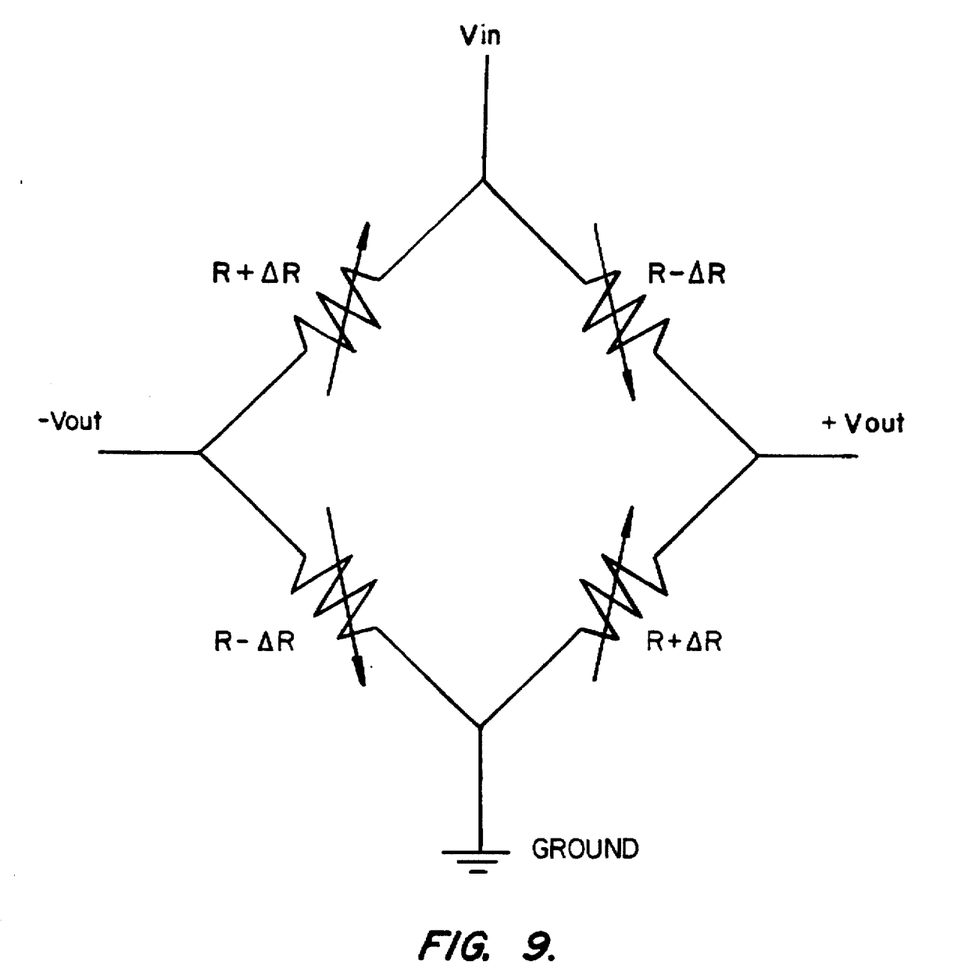
FIG. 9 is a schematic of a Wheatstone bridge.

The placement of resistors determines the sensitivity of output. The prior art placement method is known as a Wheatstone bridge. FIG. 9 shows the placement of four resistors in a Wheatstone bridge. By proper positioning of the resistors, when pressure is applied, two of the resistors increase in resistance and the other two decrease in resistance.

The manufacture of differential- and gauge-type sensors proceeds as with absolute-type sensors up through the growing of silicon dioxide in the micro-cavity as illustrated in FIG. 3F. The subsequent evacuation of the micro-cavity, however, is different. The operating characteristics of the differential- and gauge-type sensors require that the back of the wafer be opened to permit an atmosphere access to the micro-diaphragm. Therefore, in producing wafer 10C of FIG. 4A from wafer 10B of FIG. 3F, a third layer 42C of silicon nitride is deposited on both sides of wafer 10B of FIG. 3F. Thereafter, layer 42C above top 20C is patterned with a front-to-back-side alignment mark mask, and both layers 22 and 42C are etched. The remainder of layer 42C serves as the mask for the etching of the silicon of wafer 10C. The substrate of wafer 10C is etched by potassium hydroxide (KOH), at temperatures well-known in the art, producing the semiconductor of FIG. 4B with front-to-back alignment mark 50. Front-to-back alignment mark 50 permits the aligning of the masks and etchings on side 20C with the masks and etchings on side 18C. The process of passing radiation (e.g., infrared) to which silicon is permeable through such marks for alignment purposes is well known in the art.

Figure 4A:
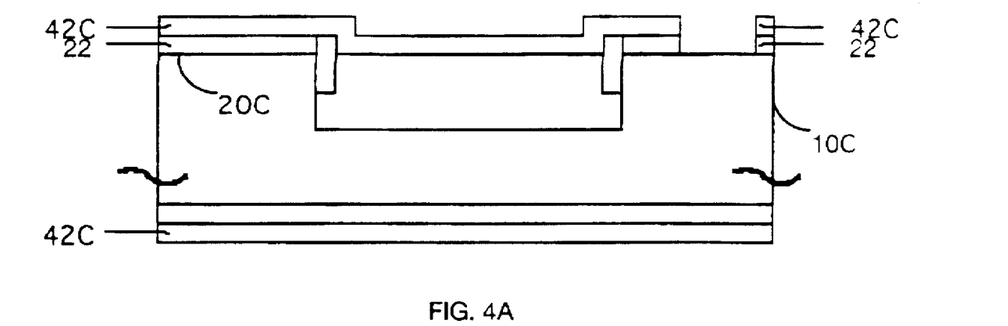
FIGS. 4A through 4G are wafer cross-sections illustrating another manufacturing method of the invention.
Figure 4B:
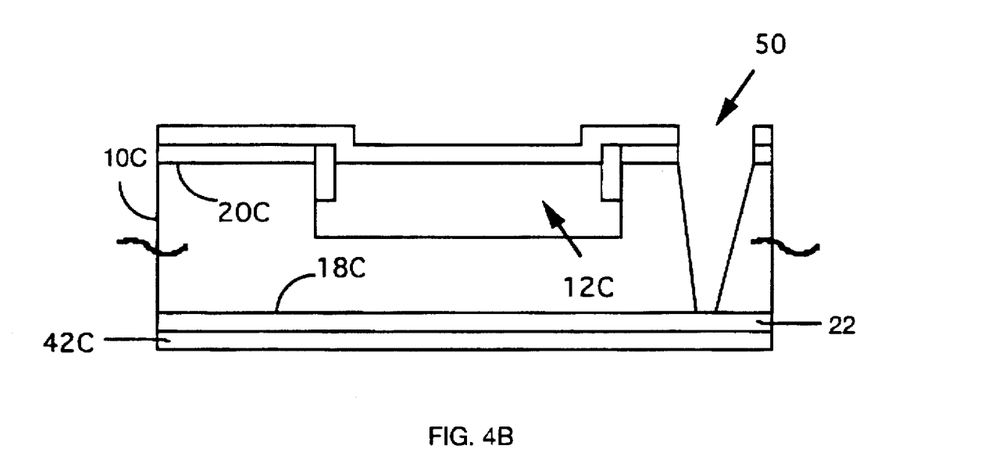
Figure 4C:
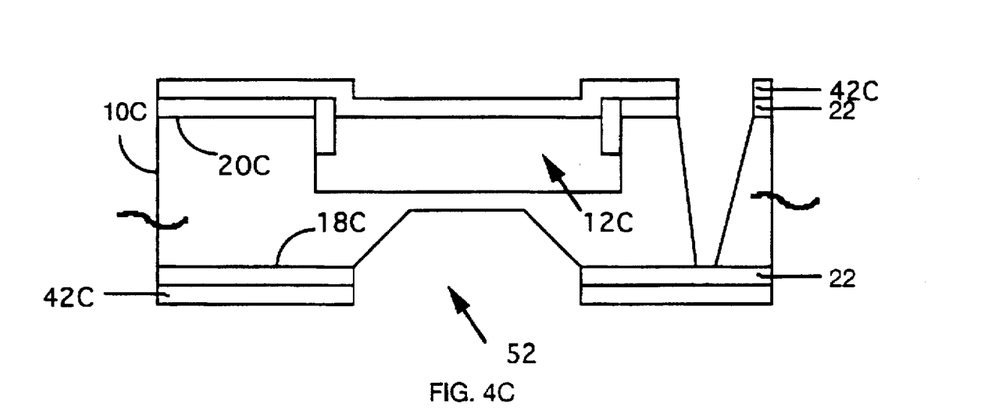
Figure 4D:
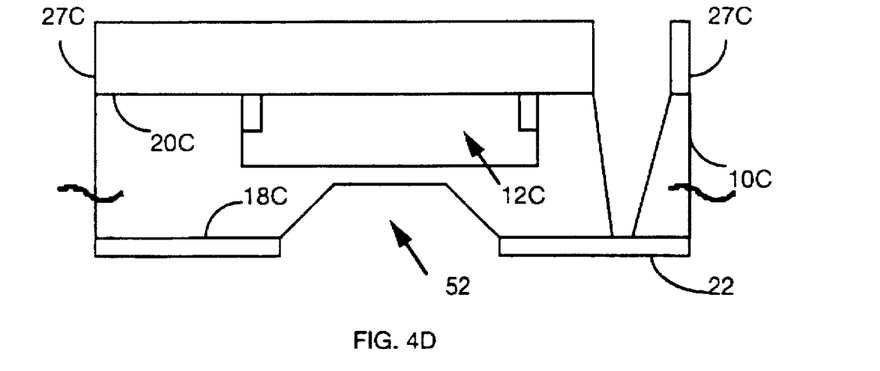

Using front-to-back alignment mark 50 to assure correct positioning, layers 42C and 22 on back 18C of substrate 10C are patterned for opening 52 (described below) and etched. Subsequently, silicon wafer 10C is time-etched until opening 52C reaches cavity 12C. The result is the wafer of FIG. 4C. In FIG. 4D, layer 42C on top 20C has been etched down 0.2 μm and then layers 42C and 22 both wet etched until top 20C is exposed. Similar to the manufacture of absolute-type sensors, polysilicon layer 27C was then deposited by LPCVD. While the front side is protected by photoresist, any polysilicon along back 18C is etched away.

Figure 4E:
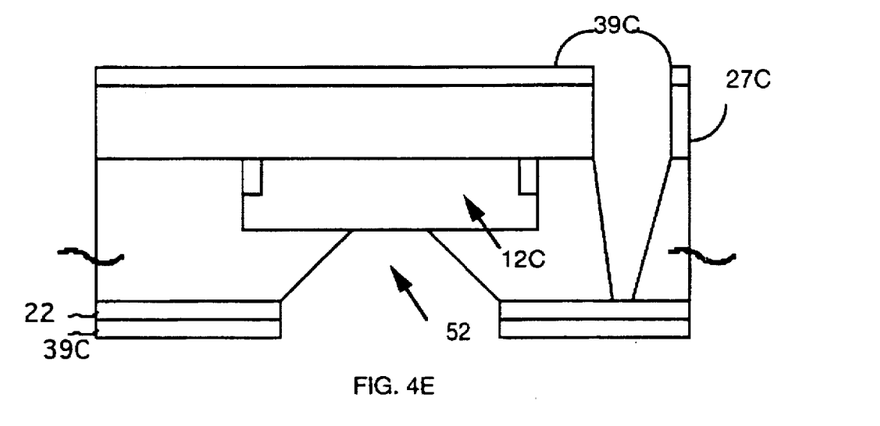
Figure 4F:
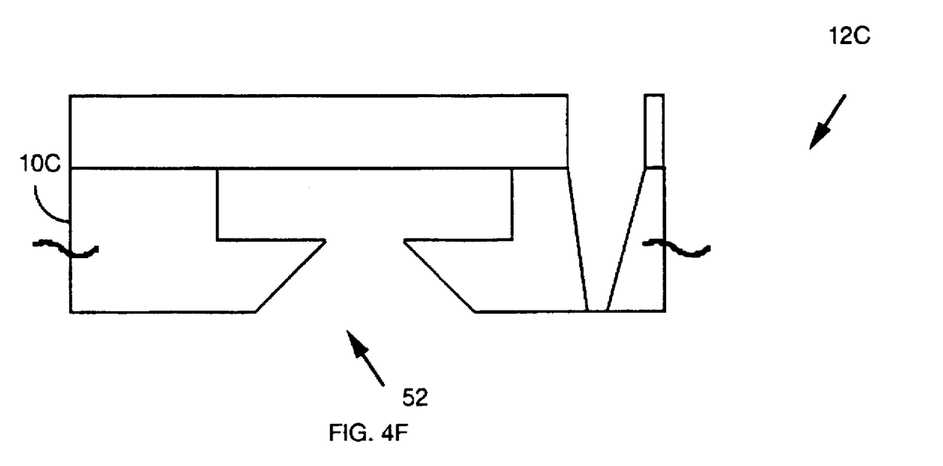
Figure 4G:
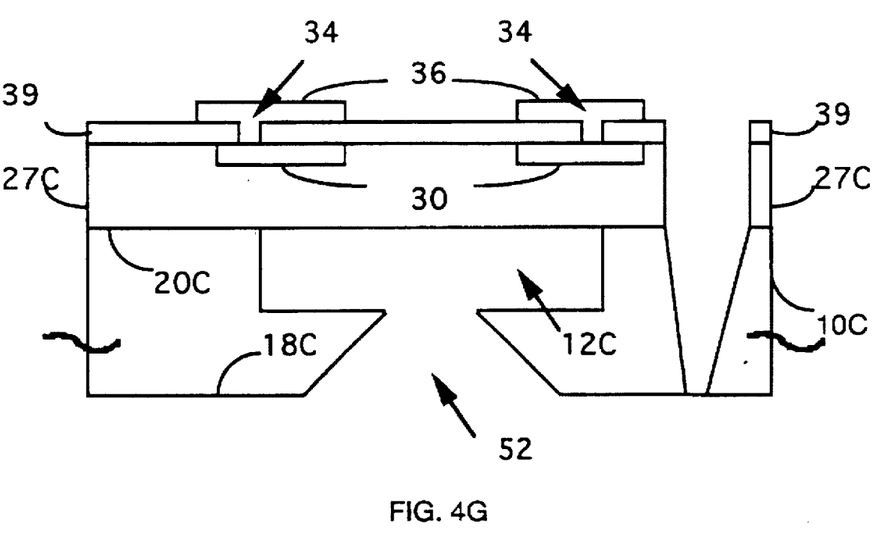

LTO layer 39C is deposited in FIG. 4E. Layer 39C overlies layer 27C, layer 22 and the bottom of cavity 52. Oxide 39C in cavity 52 is removed. Next, to produce wafer 10C of FIG. 4F, hydrofluoric acid etches wafer 10C to remove all oxide and LTO. Wafer 10C is then fully rinsed in DI water. In a process similar to absolute-type sensor manufacture, resistors 30 are patterned and implanted in layer 27C. LTO layer 39 is deposited. Contact holes 34 are opened down to resistors 30 and metal contacts 36 sputtered, patterned and etched. The product is wafer 10C of FIG. 4G.

As is apparent from the above description, opening 52 need be of no particular shape or size, so long as its bottom is smaller than the bottom of cavity 12C. In the preferred embodiment, the size of opening 52 in bottom 18C is smaller than the size of cavity 12C in top 20C. Due to the etching characteristics of crystalline silicon, this smaller size insures, with some margin for error even, that the base of opening 52 will be smaller than the bottom of cavity 12.

Also apparent from the above description is that removing oxide from cavity 12C by means of opening 52 saves two process steps. Nonetheless, cavity 12C can be evacuated by processes performed via etching from front 20C, if so preferred.

Figure 5:
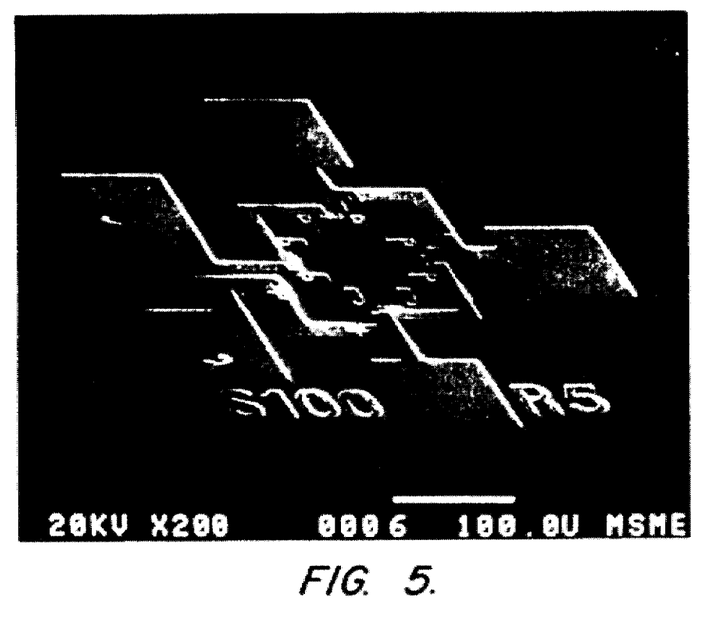
FIG. 5 is a micro-photo of square diaphragm pressure sensor manufactured according to the invention.
Figure 6:
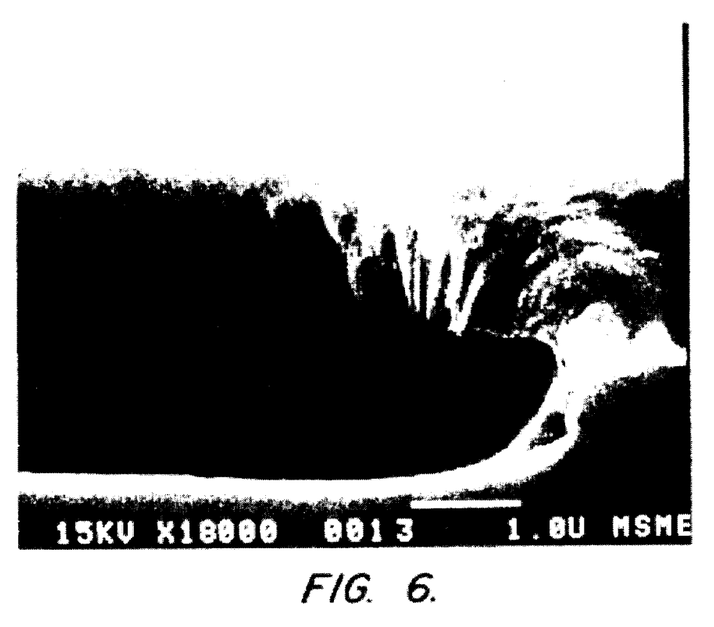
FIG. 6 is a photo of the edge of a cavity manufactured according to the invention.
Figure 7:
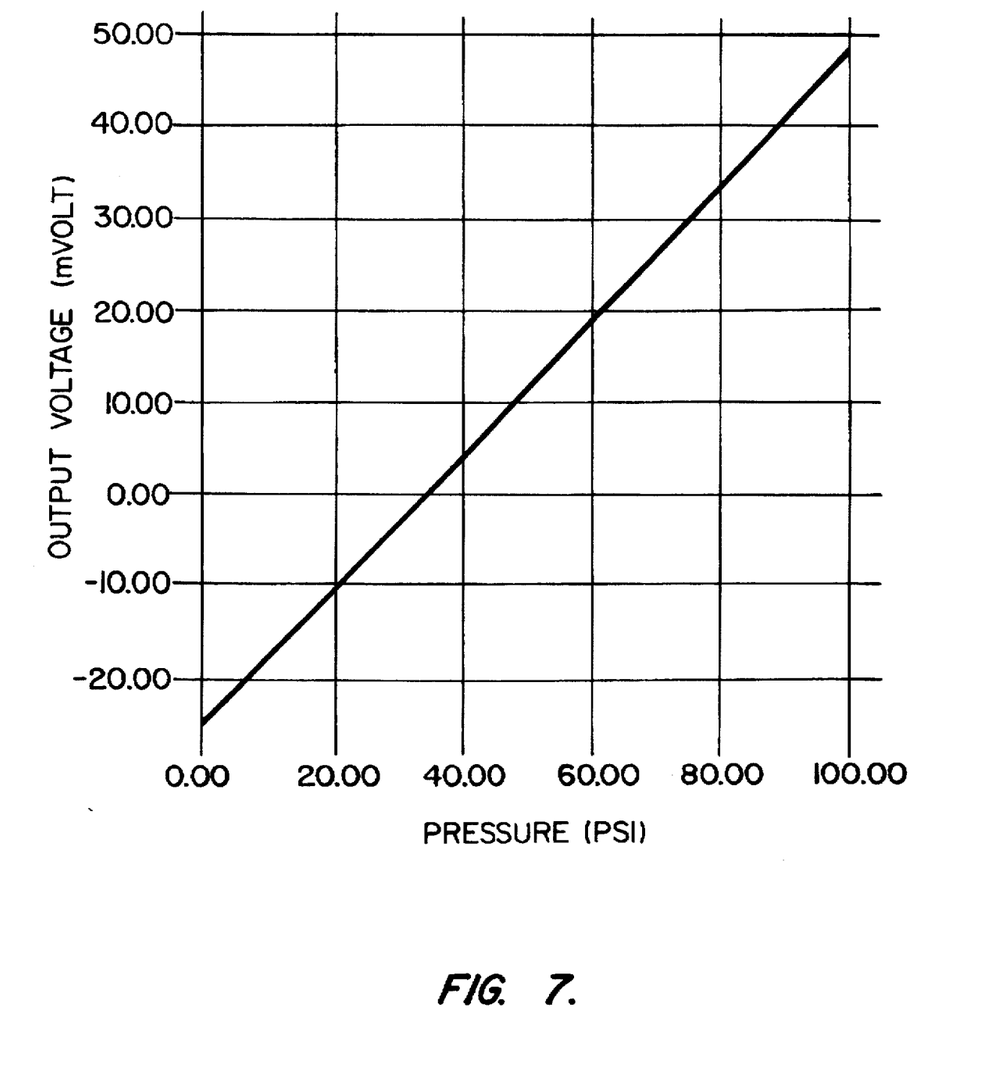
FIG. 7 is a graph of output voltage versus pressure.
Figure 8:
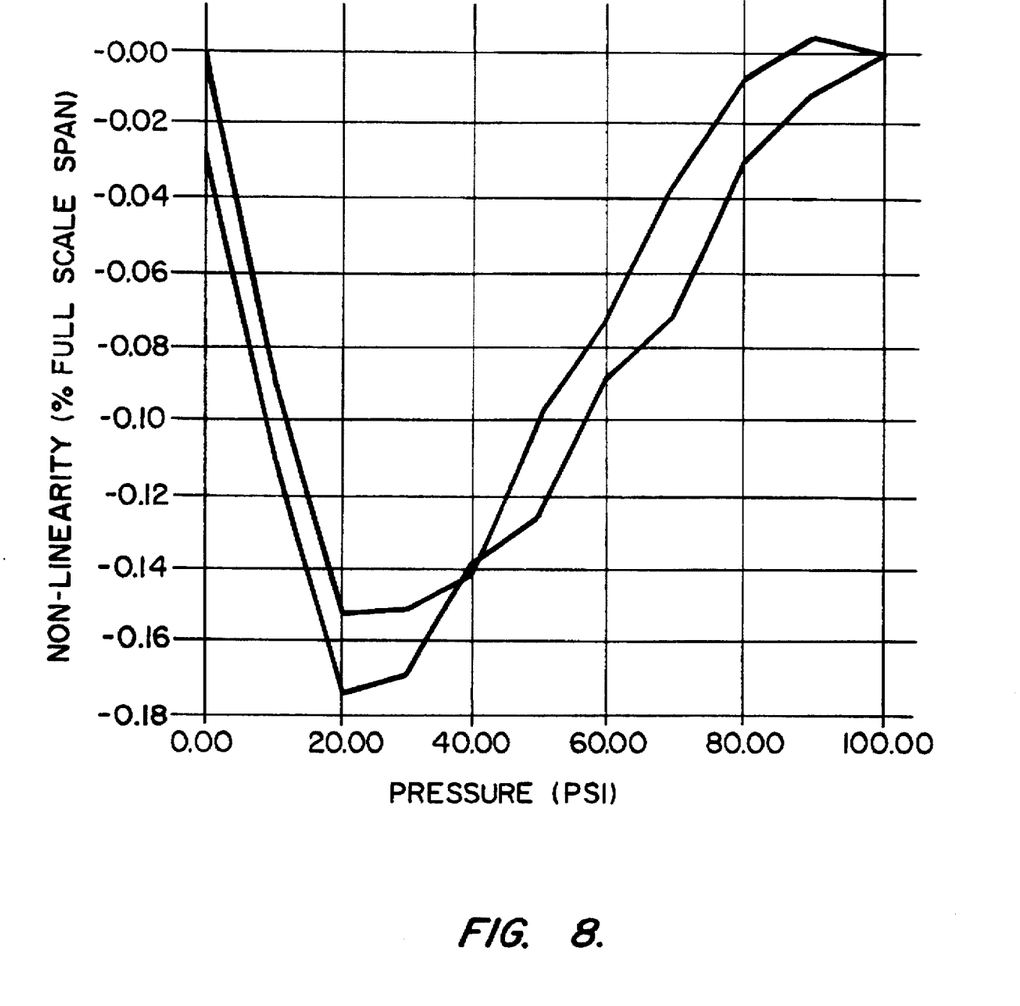
FIG. 8 is a graph plotting non-linearity versus pressure.

In practice, the above-described process of manufacturing pressure sensors has yields of over 90%. FIG. 5 shows a scanning electron microscope (SEM) micrograph of a square surface diaphragm pressure sensor manufactured according to this invention, with eight etch channels and etch holes. FIG. 6 shows the edge of the cavity under a diaphragm manufactured according to this invention. No "bird's beak" is observed, and high linearity for the sensors is thereby assured. FIG. 7 shows the output of a 0–100 PSI absolute-type pressure sensor with 5 V input voltage. A linear response has been recorded with 75 mV full scale output. The non-linearity with respect to pressure is plotted in FIG. 8. Non-linearity less than 0.2% of full scale span has been achieved.

Annealing after deposition in order to minimize stress in crystalline structures is well-known in the art.

The present invention provides significantly improved micro-machined pressure sensors and methods for manufacturing the same. It is to be understood that the above description is intended to be illustrative and not restrictive. Many changes and modifications to the invention will become apparent to those of skill in the art. For example, instead of sealing the cavity of an absolute-type pressure sensor under near-vacuum conditions, the cavity can be sealed in a significantly non-zero PSI atmosphere. In this way, a reference atmosphere is sealed into the cavity to provide a gauge-type pressure sensor manufactured with fewer process steps.

As another alternative to producing absolute-type pressure sensors, the sealing of a cavity can be performed in an atmosphere which will react with the silicon nitride and/or silicon in the walls of the cavity and precipitate to leave a near vacuum. An oxygen-rich atmosphere is such a candidate.

What is claimed is:

1. A method for micro-machining a silicon wafer, said wafer having a cavity with side walls, said method comprising:

a. depositing a material resistant to oxidation along said side walls;

b. oxidizing the silicon in said cavity, filling said cavity with silicon dioxide until the surface of said silicon dioxide is level with the top of said wafer;

c. depositing a first diaphragm layer above the top of said wafer and the surface of said silicon dioxide; and d. evacuating said cavity of said silicon dioxide and said material resistant to oxidation, producing a wafer with a diaphragm layer on top, said diaphragm layer spanning said cavity.

2. The method of claim 1, wherein said cavity has a bottom and said resistant material deposition step comprises:

a. depositing said material resistant to oxidation along said side walls and said bottom; and b. etching away said material resistant to oxidation along said bottom.

3. The method of claim 1, wherein said evacuation step comprises:

a. patterning and etching said first diaphragm layer for an etch opening; and b. etching away said silicon dioxide and said material resistant to oxidation in said cavity through said etch opening.

4. The method of claim 3, wherein before said step of diaphragm layer depositing is performed, the following steps are performed:

depositing a layer of silicon dioxide 2000Å to one micron thick above the top of said wafer and the surface of said silicon dioxide; and defining and etching said layer of silicon dioxide to make an etch channel shape, said channel shape extending over said cavity and beyond said cavity.

5. The method of claim 4, further comprising the step of:

sealing said cavity by depositing a second diaphragm layer which fills said etch opening and which forms a single, integral diaphragm layer with said first diaphragm layer.

6. The method of claim 5, wherein said step of sealing is performed under near vacuum conditions.

7. The method of claim 5, wherein said step of sealing is performed in a pre-determined atmosphere to produce a pre-determined pressure in said cavity when sealed.

8. The method of claim 1, wherein said material resistant to oxidation is silicon nitride.

9. The method of claim 5, further comprising the following steps:

a. implanting piezoresistors in said single, integral diaphragm layer;

b. depositing a passivation layer on top of said single, integral diaphragm layer;

c. opening contacts through said passivation layer to said piezoresistors; and d. metalizing for electrical connections.

10. The method of claim 5, wherein said second diaphragm layer depositing is performed by the LPCVD method.

11. A method for micro-machining a silicon wafer, said wafer having first and second sides opposite each other, said first side having a first cavity, said first cavity having side walls and a bottom, said method comprising:

a. depositing a material resistant to oxidation along said side walls;

b. oxidizing the silicon in said first cavity, filling said cavity with silicon dioxide;

c. etching a second cavity in said second side, the bottom of said second cavity reaching the bottom of said first cavity;

d. evacuating said first cavity of said silicon dioxide and said material resistant to oxidation.

12. The method of claim 11, wherein said deposition step comprises:

a. depositing said material resistant to oxidation along said side walls and said bottom of said first cavity;

b. etching away said material resistant to oxidation along said bottom of said first cavity.

13. The method of claim 11, wherein before said evacuation step, the following step is performed:

depositing a layer of polycrystalline silicon over and spanning said first cavity.

14. The method of claim 13, further comprising the step of:

implanting piezoresistors in said layer of polycrystalline silicon.

15. The method of claim 13, wherein said deposition step is performed from 680° C. to 650° C.

16. The method of claim 11, wherein said material resistant to oxidation is silicon nitride.

17. The method of claim 11, wherein said evacuation occurs through said second cavity.

18. The method of claim 11, wherein said evacuation step comprises:

a. growing a first layer of polycrystalline silicon over said first cavity;

b. patterning and etching said polycrystalline silicon layer for an etch hole;

c. etching away said silicon dioxide and said material resistant to oxidation in said cavity; and d. depositing a second layer of polycrystalline silicon which fills said etch hole and which forms a single, integral polycrystalline silicon layer with said first layer of polycrystalline silicon.

* * * * *